(12) United States Patent
Kanter et al.

(10) Patent No.: US 7,539,916 B2
(45) Date of Patent: *May 26, 2009

(54) BIST TO PROVIDE PHASE INTERPOLATOR DATA AND ASSOCIATED METHODS OF OPERATION

(75) Inventors: Ofir Kanter, Haifa (IL); Eran Peleg, Akko (IL); Yesayahu Levy, Karkur (IL)

(73) Assignee: Intel Corporation, Santa Clara, CA (US)

( * ) Notice: Subject to any disclaimer, the term of this patent is extended or adjusted under 35 U.S.C. 154(b) by 558 days.

This patent is subject to a terminal disclaimer.

(21) Appl. No.: 11/169,316

(22) Filed: Jun. 28, 2005

(65) Prior Publication Data

US 2006/0294442 A1    Dec. 28, 2006

(51) Int. Cl.
*G01R 31/28* (2006.01)
(52) U.S. Cl. ..................................... 714/731
(58) Field of Classification Search ............... 714/733, 714/731
See application file for complete search history.

(56) References Cited

U.S. PATENT DOCUMENTS

| | | | |
|---|---|---|---|
| 5,471,412 A | 11/1995 | Shyu | |
| 5,550,765 A | 8/1996 | Bhattacharya et al. | |
| 5,563,552 A | 10/1996 | Gersbach et al. | |
| 5,610,849 A | 3/1997 | Huang | |
| 5,657,253 A | 8/1997 | Dreyer et al. | |
| 5,663,991 A | 9/1997 | Kelkar et al. | |
| 5,668,748 A | 9/1997 | Huang | |
| 5,737,256 A | 4/1998 | Nakagawa et al. | |
| 5,852,630 A | 12/1998 | Langberg et al. | |
| 5,889,435 A | 3/1999 | Smith et al. | |
| RE36,183 E | 4/1999 | Artieri | |
| 6,088,829 A * | 7/2000 | Umemura et al. | 714/798 |
| 6,115,763 A | 9/2000 | Douskey et al. | |
| 6,195,674 B1 | 2/2001 | Elbourne et al. | |
| 6,237,012 B1 | 5/2001 | Ohgose | |
| 6,327,602 B1 | 12/2001 | Kim | |
| 6,430,720 B1 * | 8/2002 | Frey et al. | 714/744 |
| 6,463,109 B1 | 10/2002 | McCormack et al. | |

(Continued)

FOREIGN PATENT DOCUMENTS

DE    10 2004 007 648 B3    9/2005

OTHER PUBLICATIONS

Baker, R. J., et al., "Figures from CMOS Circuit Design, Layout, and Simulation", *IEEE Press Series on Microelectric Systems*, Wiley Interscience, (1998), 11 pgs.

(Continued)

*Primary Examiner*—James C Kerveros
(74) *Attorney, Agent, or Firm*—Schwegman, Lundberg & Woessner, P.A.

(57) ABSTRACT

In an embodiment, a phase interpolator (PI) circuit is in an integrated circuit with a test latch, and the test latch is enabled by a test clock signal to under-sample the PI output clock signal from the signal source. In a method of operation, a PI output clock signal is generated in an integrated circuit, and the PI output clock signal is under-sampled in a test latch in the integrated circuit triggered by a test clock signal. Output data from the test latch is transmitted to a test device that is separated from the integrated circuit.

27 Claims, 6 Drawing Sheets

U.S. PATENT DOCUMENTS

| | | |
|---|---|---|
| 6,564,347 B1 | 5/2003 | Mates |
| 6,611,870 B1 | 8/2003 | Asano et al. |
| 6,647,438 B1 | 11/2003 | Connor et al. |
| 6,650,159 B2 | 11/2003 | Wang et al. |
| 6,728,311 B1 | 4/2004 | Waschura et al. |
| 6,747,490 B1 | 6/2004 | Jaussi et al. |
| 6,754,749 B1 | 6/2004 | Mounsef et al. |
| 6,774,686 B2 | 8/2004 | Kennedy et al. |
| 6,883,127 B2 * | 4/2005 | Slawecki et al. ............ 714/726 |
| 6,995,554 B2 * | 2/2006 | Loke et al. ............... 324/76.54 |
| 7,149,269 B2 | 12/2006 | Cranford et al. |
| 7,191,371 B2 | 3/2007 | Hsu et al. |
| 7,216,183 B2 * | 5/2007 | Ho et al. ......................... 710/5 |
| 7,225,289 B2 * | 5/2007 | Tee et al. .................... 710/315 |
| 7,251,764 B2 | 7/2007 | Bonneau et al. |
| 7,325,175 B2 * | 1/2008 | Momtaz .................... 714/704 |
| 2001/0006343 A1 | 7/2001 | Yoshizawa |
| 2002/0053048 A1 | 5/2002 | Matsumoto et al. |
| 2003/0005379 A1 | 1/2003 | Slawecki et al. |
| 2003/0172327 A1* | 9/2003 | Chen et al. .................. 714/700 |
| 2003/0191592 A1 | 10/2003 | Mueller |
| 2005/0076279 A1* | 4/2005 | Cranford et al. ............ 714/732 |
| 2005/0193290 A1* | 9/2005 | Cho et al. ................... 714/710 |
| 2005/0193301 A1* | 9/2005 | Partovi et al. ............... 714/727 |
| 2005/0193390 A1 | 9/2005 | Suzuki et al. |
| 2005/0207522 A1 | 9/2005 | Lindner et al. |
| 2006/0290398 A1 | 12/2006 | Kanter et al. |
| 2007/0002994 A1 | 1/2007 | Kanter et al. |
| 2007/0018703 A1 | 1/2007 | Kanter et al. |

OTHER PUBLICATIONS

Xia, T., et al., "Time-to-Voltage Converter for On-Chip Jitter Measurement", *IEEE Transactions on Instrumentation and Measurement*, 52(6). (Dec. 2003), 1738-1748.

"U.S. Appl. No. 11/169,164, Non Final Office Action mailed Mar. 4, 2008", 8 pgs.

"U.S. Appl. No. 11/169,164, Non Final Office Action mailed Jul. 21, 2008", 9 pgs.

"U.S. Appl. No. 11/169,164, Notice Of Allowance mailed Nov. 21, 2008", 7 pgs.

"U.S. Appl. No. 11/169,164, Response filed Jun. 4, 2008 to Non Final Office Action mailed Mar. 4, 2008", (Jun. 4, 2008), 10 pgs.

"U.S. Appl. No. 11/173,145, Non Final Office Action mailed Mar. 21, 2008", 6 pgs.

"U.S. Appl. No. 11/173,145, Non Final Office Action mailed Sep. 30, 2008", 8 pgs.

"U.S. Appl. No. 11/173,145, Response filed Jun. 23, 2008 to Non Final Office Action mailed Mar. 21, 2008", 18 pgs.

"U.S. Appl. No. 11/173,145, Non Final Office Action mailed May 23, 2008", 15 pgs.

* cited by examiner

BIST TO PROVIDE PHASE INTERPOLATOR DATA AND ASSOCIATED METHODS OF OPERATION

TECHNICAL FIELD

This application relates generally to testing of integrated circuits and, more particularly, to a Built-In Self-Tester (BIST) to provide phase interpolator data and associated methods of operation.

BACKGROUND

Peripheral Component Interconnect Express (PCI-E) is an example of a communication protocol in which the clock of two clients is not common, and each client uses its own clock reference. In this case, the receive side must implement a clock recovery mechanism in order to sample the received data in the right phase. An important part of the clock recovery mechanism is a Phase Interpolator (PI), a block which is responsible to shift the phase up and down according to time recovery controls, and sample the received data in the right phase. The PI block is capable of generating multiple phases, also called taps.

PI testing in manufacturing is very important for several reasons. The PI block is usually an analog block that is sensitive. It is also not trivial to check the PI block during a functional test, since not all the taps of the PI block are usually used. Finally, the quality of this block is essential to chip robustness in user platform.

One of the ways to test a PI block in production is to inject a signal with parts per million (PPM) into the PI block and verify that the receive path works well. The PPM data will force the PI block to go over all its taps. The disadvantages of this method are several. The need to inject the PPM data into a receive path usually requires an expensive tester with special capabilities or a unique ad hoc external instrument which is attached to the tester. Only a "life test" of the PI block is provided. Integral non-linearity (INL) and Differential non-linearity (DNL) parameters can't be found.

There is a need for improved circuits and methods for PI testing.

DETAILED DESCRIPTION

In the following detailed description of various embodiments, reference is made to the accompanying drawings that form a part hereof, and in which are shown by way of illustration, and not of limitation, specific embodiments in which the subject matter may be practiced. In the drawings, like numerals describe substantially similar components throughout the several views. The embodiments illustrated are described in sufficient detail to enable those skilled in the art to practice the teachings disclosed herein. Other embodiments may be utilized and derived therefrom, such that compositional, structural, and logical substitutions and changes may be made without departing from the scope of this disclosure. The following detailed description, therefore, is not to be taken in a limiting sense. Examples and embodiments merely typify possible variations. Individual components and functions are optional unless explicitly required, and the sequence of operations may vary. Portions and features of some embodiments may be included in or substituted for those of others. The following description is, therefore, not to be taken in a limiting sense.

According to various embodiments, a Phase Interpolator (PI) Built-In Self-Tester (BIST) is located in an integrated circuit die to provide a way to measure PI integral non-linearities and differential non-linearities (INL/DNL). According to various embodiments, a tester drives the BIST with a clock in low frequency, and there is no need for special tester capabilities. A precise latch is located in a silicon chip that receives the PI output clock and a low frequency precise clock (latch enable) from the tester. According to various embodiments, the phase differences between each of two taps are found, and then the INL/DNL are found. A PI block has high clock frequency. A test of the PI block is done with a simple digital tester, and only a low frequency clock is driven from the tester. By tuning the clock to a specific frequency, we can under sample the PI output clock and transfer it out to a tester memory. The test is built of several iterations, as many as the number of taps. In each iteration, the PI output clock is sampled to find the location of the clock transition (related to a stable time point), and then the test moves one tap up or down.

Figure 1:
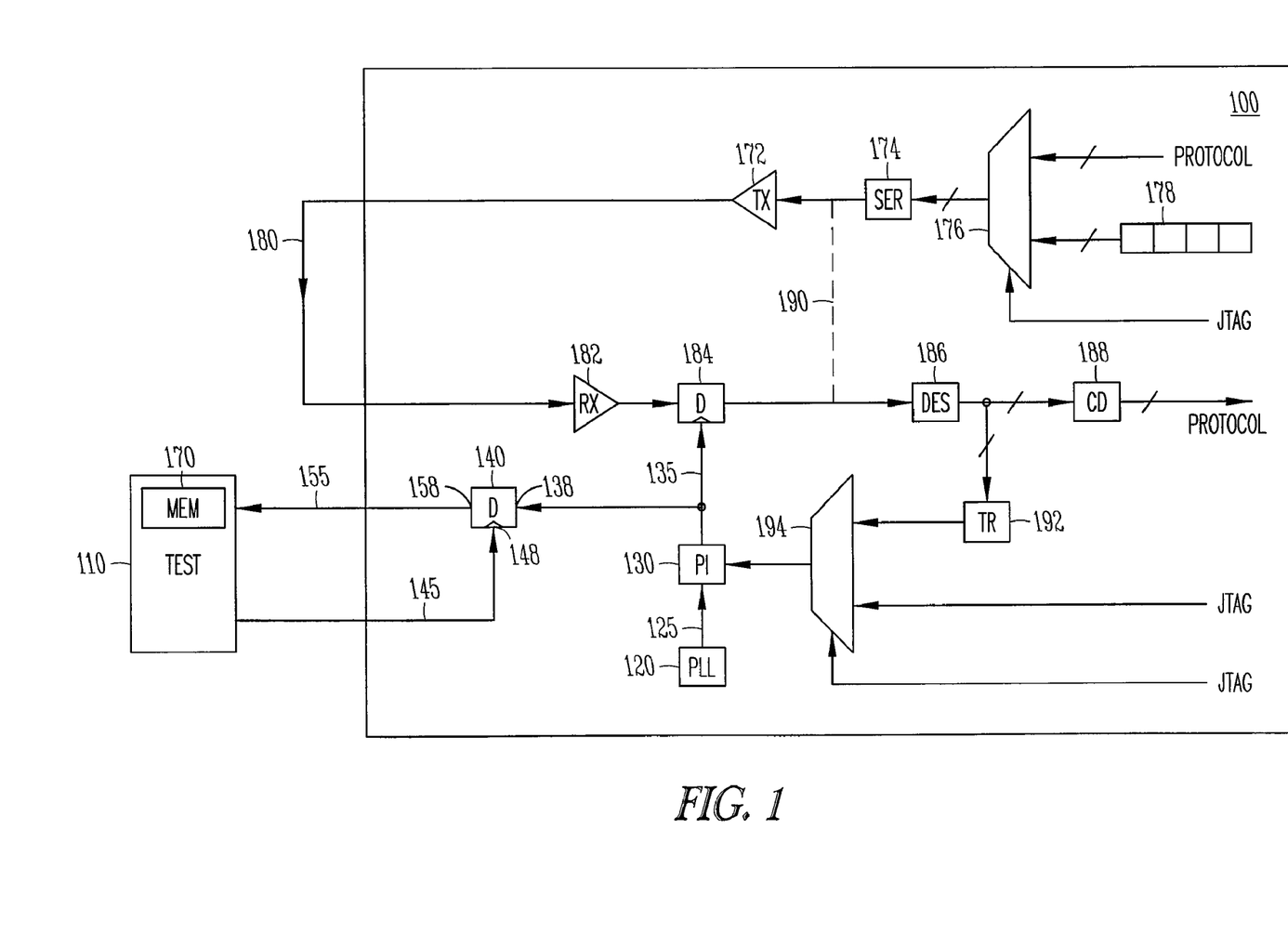
FIG. 1 is a block diagram of an integrated circuit die and a test device according to various embodiments.

FIG. 1 is a block diagram of an integrated circuit die 100 and a test device 110 according to various embodiments. The die 100 is a silicon chip, an elements of an integrated circuit are formed on the silicon chip. The test device 110 is separated from the integrated circuit die 100, and is not part of the same silicon chip.

A Phase Locked Loop (PLL) 120 is located in the die 100, and is coupled to a PI circuit 130 to provide a timing reference signal 125. The PI circuit 130 generates a PI output clock signal 135 based on the timing reference signal 125. The PI output clock signal 135 is coupled to a PI signal input 138 of a test latch 140. The PI circuit 130 and the test latch 140 are also located in the die 100. The test latch 140 is coupled to receive a low frequency test clock signal 145 at a clock input 148. The test latch 140 is triggered or enabled by the test clock signal 145 to sample the PI output clock signal 135.

The test clock signal 145 is generated by the test device 110 and coupled to the die 100 including the test latch 140.

The test latch 140 transmits output data 155 through a data output 158 to the test device 110. The output data 155 includes samples of the PI output clock signal 135 sampled by the test latch 140. The output data 155 is stored in a memory 170 in the test device 110. The memory 170 is a Flash memory or a random access memory (RAM) or a disk drive storage device or any other type of appropriate memory.

Design for testability (DFT) features are included in an integrated circuit to provide for embedded testing of certain integrated circuit functions. The test latch 140 according to various embodiments is a BIST and a DFT feature.

The integrated circuit die 100 includes elements of a transmitter/receiver or transceiver circuit according to various embodiments. The integrated circuit die 100 also includes inputs to be coupled to receive signals from boundary scan circuitry in accordance with the Institute of Electrical and Electronics Engineers (IEEE) specification 1149.1 promulgated by the Joint Test Action Group (JTAG). Such signals are called JTAG signals, and are used to control a test of an integrated circuit such as the integrated circuit die 100.

The integrated circuit die 100 includes a transmit driver 172 driving digital signals from a serializer 174, the serializer receiving digital data from a multiplexer 176. When the integrated circuit die 100 is operating in a non-test mode, the multiplexer 176 couples digital data supplied from a protocol to the serializer 174. In a test mode, known digital data stored in a 40-bit memory 178 is coupled through the multiplexer 176 to the serializer 174, and the multiplexer 176 is controlled by a JTAG signal. The test latch 140 transmits the output data 155 to the test device 110 during the test mode.

An external loop-back conductor 180 couples the digital signals from the transmit driver 172 to an input of a receive driver 182, and passes outside the integrated circuit die 100. The receive driver 182 drives the digital signals to a latch 184 triggered or enabled by the PI output clock signal 135. The latch 184 generates serial digital data that is coupled through a deserializer 186 and a comma detect circuit 188 to the protocol when the integrated circuit die 100 is operating in the non-test mode. An internal loop-back conductor 190 couples an output of the serializer 174 to an input of the deserializer 186, and can be used as an alternative to the external loop-back conductor 180.

During the non-test mode, the PI circuit 130 is controlled by a time recovery (TR) block 192 that receives the digital data from the deserializer 186 and couples control signals through a multiplexer 194 to the PI circuit 130. The TR block 192 controls the tap or phase generated by the PI circuit 130 in this manner. During the test mode, the multiplexer 194 is controlled by a JTAG signal to block the control signals from the TR block 192 and pass JTAG control to the PI circuit 130 to move the tap of the PI circuit 130 up or down.

Figure 2:
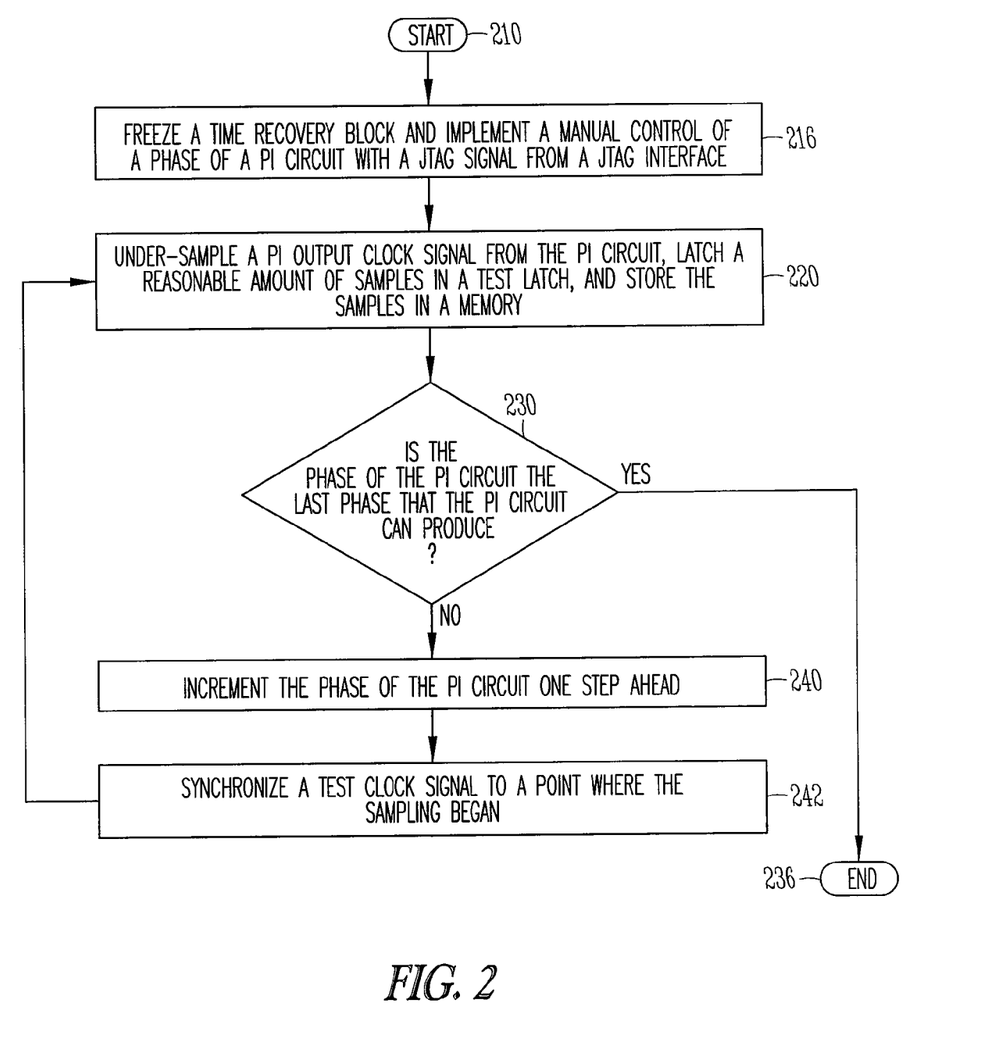
FIG. 2 is a flow diagram of several methods according to various embodiments.

FIG. 2 is a flow diagram of several methods of operating the integrated circuit die 100 in the test mode according to various embodiments. In 210, the methods start.

In 216, the TR block 192 is frozen, and a manual control of the phase of the PI circuit 130 is implemented with the JTAG signal from a JTAG interface (not shown).

In 220, the PI output clock signal 135 is under-sampled and a reasonable amount of samples are latched in the test latch 140 and stored in the memory 170. As an example, one unit interval (UI) of samples is latched and stored.

In 230, the flow determines whether the phase of the PI circuit 130 is the last phase that the PI circuit 130 can produce, and if so, the methods end in 236.

If the PI circuit 130 can produce a phase not yet sampled, the phase of the PI circuit 130 is incremented one step ahead in 240.

In 242, the test clock signal 145 is synchronized to a point where the sampling began in 220, and the methods return to 220 where the PI output clock signal 135 is under-sampled.

It should be noted that the individual activities shown in the flow diagram do not have to be performed in the order illustrated or in any particular order. Moreover, various activities described with respect to the methods identified herein can be executed in serial or parallel fashion. Some activities may be repeated indefinitely, and others may occur only once. Various embodiments may have more or fewer activities than those illustrated.

After the iterations of the methods of FIG. 2 are done, mathematical post processing is implemented to extract linearity results from the samples. The post processing is done in the test device 110 to determine the phase difference of each transition, and to calculate the INL/DNL of the PI output clock signal 135.

Figure 3:
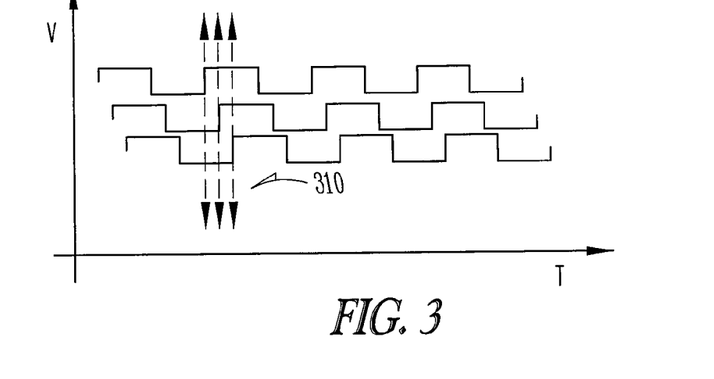
FIG. 3 is a plot of a Phase Interpolator (PI) output clock signal according to various embodiments.

FIG. 3 is a plot of the PI output clock signal 135, and in particular, three different taps of the PI output clock signal 135, according to various embodiments. The plot of FIG. 3 shows voltage v of signals with respect to time t. The different taps of the PI output clock signal 135 each have a different phase as is illustrated in FIG. 3, with the arrows 310 indicating the phase differences. The PI circuit 130 is capable of producing more taps than are shown in FIG. 3 according to various embodiments.

Figure 4A:
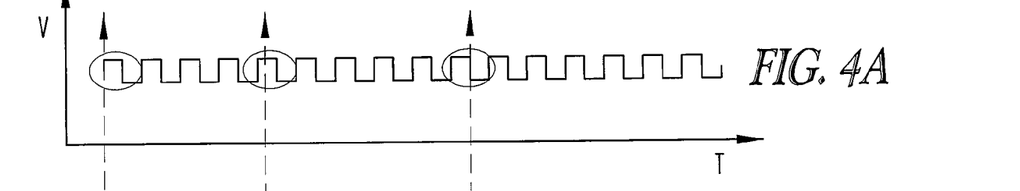
FIG. 4A-4D is a plot of an under-sampling method according to various embodiments.
Figure 4B:
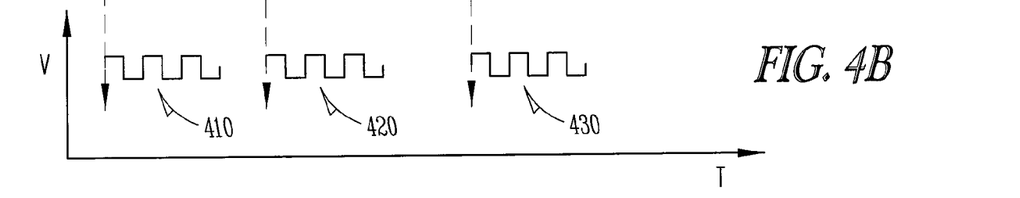
Figure 4C:
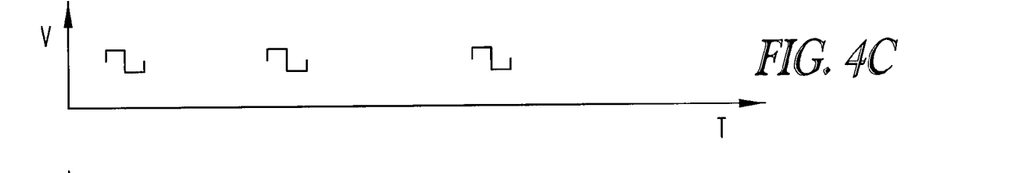
Figure 4D:
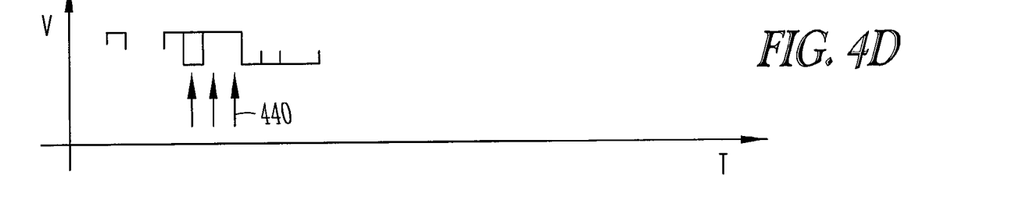

FIG. 4A-4D are a plot of an under-sampling method according to various embodiments. The plots of FIG. 4A-4D show voltage v of signals with respect to time t. FIG. 4A is a plot of the test clock signal 145. FIG. 4B is a plot of three different taps (also called phases) 410, 420, and 430 of the PI output clock signal 135. The different taps of the PI output clock signal 135 each have a different phase that is aligned differently with respect to the test clock signal 145. The PI output clock signal 135 is sampled in the test latch 140 via the test clock signal 145 to result in an under-sampled signal. A plot of under-sampled portions of each of the three different taps 410, 420, and 430 is shown in FIG. 4C. FIG. 4D is a plot of a comparison of the different phases of each of the three different taps 410, 420, and 430, with the arrows 440 indicating the phase differences.

Figure 5:
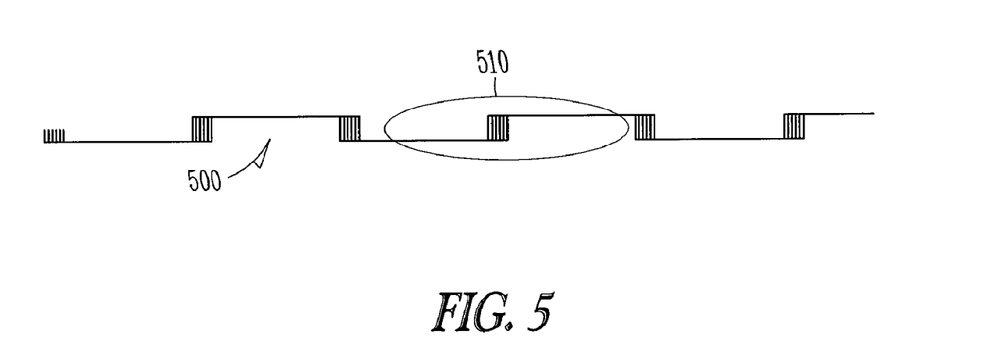
FIG. 5 is a plot of multiple samples of a PI output clock signal according to various embodiments.

FIG. 5 is a plot of multiple samples 500 of a PI output clock signal according to various embodiments. The plot of FIG. 5 shows a voltage of the samples 500 with respect to time. The samples 500 are generated as the test latch 140 is triggered or enabled by the test clock signal 145, and samples for a single transition 510, or more, are collected. The samples 500 are transmitted from the test latch 140 to the test device 110, where they are stored in the memory 170.

Figure 6:
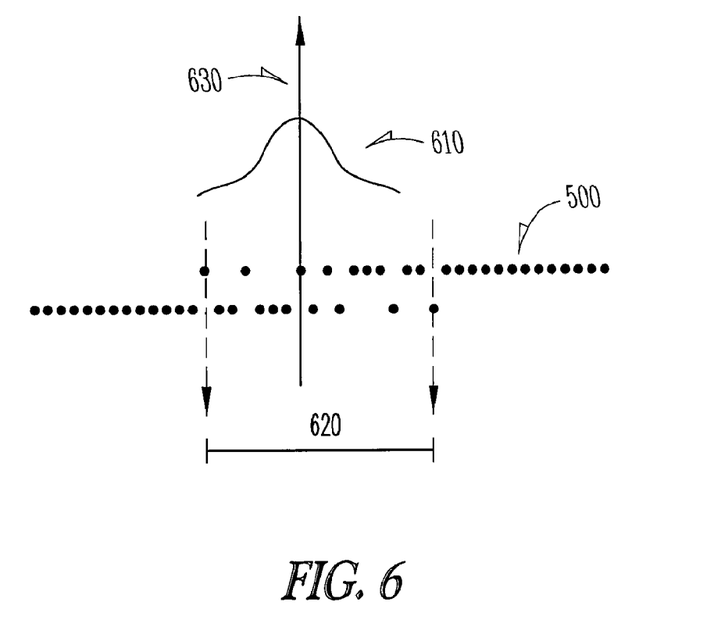
FIG. 6 is a plot of a Gaussian distribution according to various embodiments.

FIG. 6 is a plot of a Gaussian distribution 610 generated from the samples 500 inside a transition window 620 according to various embodiments. A mean 630 of the Gaussian distribution 610 is an estimate of an edge of a single phase of the PI output clock signal. The location of each tap or phase of the PI output clock signal is determined this way according to various embodiments.

Figure 7:
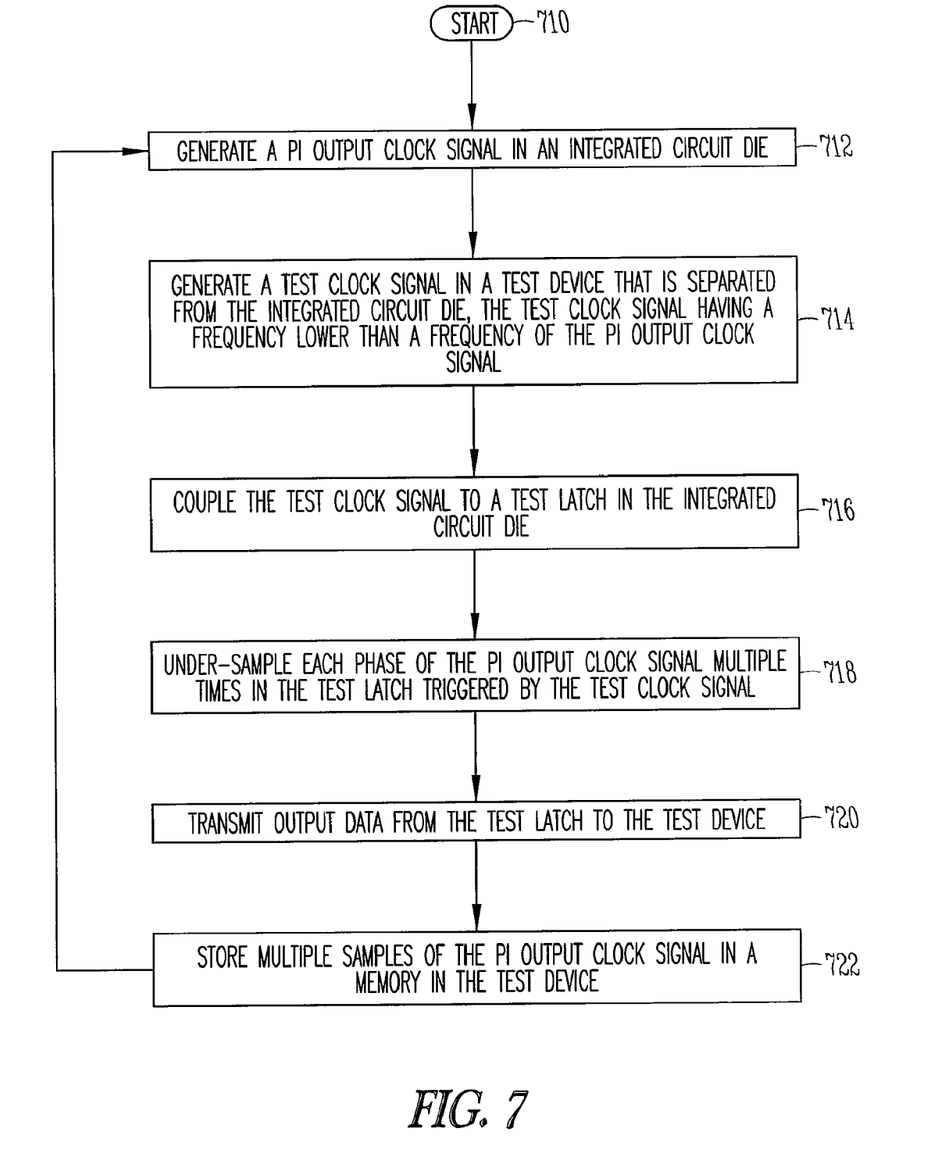
FIG. 7 is a flow diagram of several methods according to various embodiments.

FIG. 7 is a flow diagram of several methods according to various embodiments. In 710, the methods start.

In 712, a PI output clock signal is generated in an integrated circuit die.

In 714, a test clock signal is generated in a test device that is separated from the integrated circuit die, the test clock signal having a frequency lower than a frequency of the PI output clock signal.

In 716, the test clock signal is coupled to a test latch in the integrated circuit die.

In 718, each phase of the PI output clock signal is under-sampled multiple times in the test latch triggered by the test clock signal.

In 720, output data is transmitted from the test latch to the test device.

In 722, multiple samples of the PI output clock signal are stored in a memory in the test device, and the methods return to 712.

It should be noted that the individual activities shown in the flow diagram do not have to be performed in the order illustrated or in any particular order. Moreover, various activities described with respect to the methods identified herein can be executed in serial or parallel fashion. Some activities may be repeated indefinitely, and others may occur only once. Various embodiments may have more or fewer activities than those illustrated.

Figure 8:
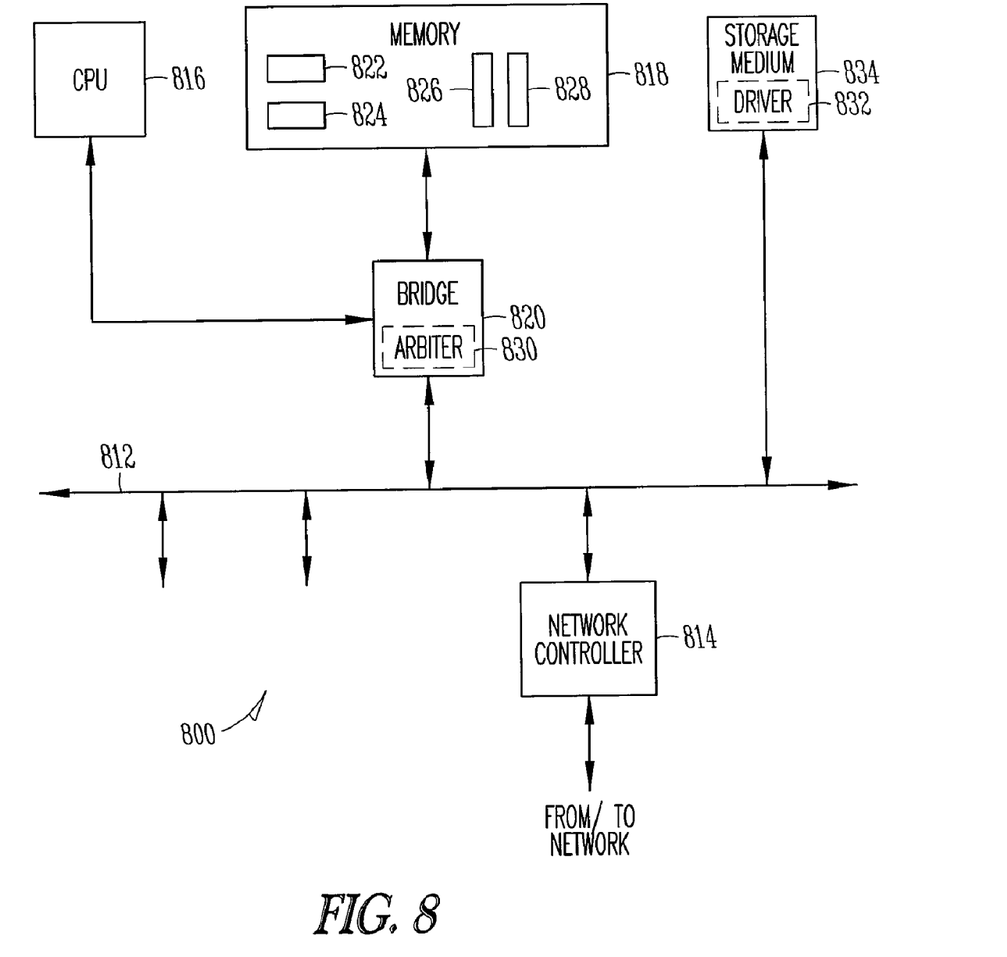
FIG. 8 is a block diagram of a system according to various embodiments.

FIG. 8 is a block diagram of a system 800 according to various embodiments. The following explanation regarding FIG. 8 is an example of how the die 100 is integrated in a system environment and is not for testing. The die 100 will be tested with a dedicated test device according to various embodiments.

The system 800 is a personal computer (PC), laptop computer, wireless device, switch, router, or the like having the capability to connect to a network (not shown). The system 800 includes a bus 812, which is a peripheral component interconnect express (PCI-E) bus, for example. It is to be appreciated that the bus 812 may be another type of bus, such as a universal serial bus (USB), serial deserial (SRDS), peripheral component interconnect (PCI) bus, or InfiniBand.

Several devices are directly or indirectly coupled to the bus 812. For instance, an input/output (I/O) controller or network controller 814 is coupled to the bus 812 and allows the system 800 to send/receive network data, typically in the form of packets or frames. In one embodiment, the network controller 814 (sometimes referred to as an "adapter") is an Ethernet media access controller (MAC) or network interface card (NIC). The network controller 814 can be another type of network controller, an I/O controller such as a small computer system interface (SCSI) controller, or a card. The network controller 814 includes a test latch and other hardware and implements methods according to one or more of the various embodiments presented herein.

A processor 816, such as a central processing unit (CPU), and a storage unit or memory 818 are coupled to the bus 812 via a bridge 820. The memory 818, referred to as a "host memory" or a "system memory," is a random access memory (RAM) and includes a plurality of data buffers 822, 824, 826, and 828.

To provide arbitration for the use of the bus 812 (e.g., when reading from or writing to the memory 818), the bridge 820 includes an arbiter 830. A driver 832 controls operation of the network controller 814 (when the network controller 814 is made a bus master by the arbiter 830), and performs other operations. The driver 832 is embodied in software that is stored in a machine-readable storage medium 834 coupled to the bus 812, such as a hard disk drive of the system 800. The driver 832 is executed by the processor 816. Execution of the software of the driver 832, during normal operation, can include copying this software into the memory 818 and/or into a cache (not shown) of the processor 816, and execution of this software from that location.

The various embodiments presented herein describe a way to find PI INL/DNL. An advantage of the various embodiments presented herein is that the test is very easy and cheap to implement and execute. There is no need for any special capabilities from a tester. The various embodiments presented herein will contribute to lower manufacturing costs of chips by reducing production tester's costs.

The various embodiments presented herein can be implemented in an integrated circuit chip with a high speed bus interface such as PCI, PCI-E, SRDS, or Infiniband. Integrated circuits according to the various embodiments presented herein are formed in any type of semiconductor material, including silicon.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" may be used as the plain-English equivalents of the respective terms "comprising" and "wherein," respectively. Moreover, the terms "first," "second," and "third," etc. are used merely as labels, and are not intended to impose numerical requirements on their objects.

What is claimed is:

1. A method comprising:
   generating a first signal in an integrated circuit die;
   under-sampling the first signal in a test latch on the integrated circuit die triggered by a test clock signal, the test clock signal having a frequency lower than a frequency of the first signal; and
   transmitting samples of the first signal from the test latch to a test device that is separated from the integrated circuit die.

2. The method of claim 1 wherein generating a first signal further comprises generating the first signal in a silicon chip.

3. The method of claim 1, further comprising:
   generating the test clock signal in the test device; and
   coupling the test clock signal to the test latch.

4. The method of claim 1 wherein under-sampling the first signal further comprises under-sampling the first signal multiple times.

5. The method of claim 4 wherein transmitting samples of the first signal further comprises storing multiple samples of the first signal in a memory in the test device.

6. The method of claim 1 wherein generating a first signal further comprises:
   generating a reference signal in a Phase Locked Loop (PLL) on the integrated circuit die; and
   generating a phase interpolator (PI) output clock signal based on the reference signal in a PI circuit on the integrated circuit die.

7. The method of claim 1 wherein transmitting samples of the first signal further comprises transmitting digital samples of the first signal from the test latch to the test device, the test device being coupled to the test latch.

8. A system comprising:
   a signal source to provide a first signal having a first frequency, the signal source being on an integrated circuit die;

a test device separated from the integrated circuit die; and a test latch on the integrated circuit die, the test latch including:
- a first input coupled to receive the first signal;
- a clock input to receive a test clock signal, the test clock signal having a frequency lower than the first frequency; and
- a data output to provide samples of the first signal, the test latch to under-sample the first signal in accordance with the test clock signal, the data output being coupled to transmit the samples of the first signal to the test device.

9. The system of claim 8 wherein the die is a silicon chip.

10. The system of claim 8 wherein the signal source comprises:
- a PLL to generate a reference signal; and
- a first circuit to receive the reference signal and to generate a first signal.

11. The system of claim 10 wherein:
- the first circuit is a phase interpolator (PI) circuit; and
- the first signal is a PI output clock signal.

12. The system of claim 11, further comprising:
- a receiver latch in a receiver circuit on the integrated circuit die, the receiver latch being coupled to the PI circuit to receive the PI output clock signal; and
- a time recovery circuit coupled through a multiplexer to the PI circuit to control the PI circuit.

13. The system of claim 8 wherein:
- the clock input is to be coupled to the test device to receive the test clock signal, the test device to generate the test clock signal; and
- the data output is to be coupled to the test device to transmit the samples of the first signal through a multiplexer to the test device.

14. The system of claim 13 wherein the test device includes a memory to store the samples of the first signal.

15. A method comprising:
- generating a phase interpolator (PI) output clock signal in an integrated circuit die;
- receiving a test clock signal in the integrated circuit, the test clock signal having a frequency lower than a frequency of the PI output clock signal;
- under-sampling the PI output clock signal in a test latch on the integrated circuit die, the under-sampling being triggered by the test clock signal; and
- transmitting samples of the PI output clock signal from the test latch to a test device that is separated from the integrated circuit die.

16. The method of claim 15 wherein generating a PI output clock signal further comprises generating the PI output clock signal in a silicon chip.

17. The method of claim 15, further comprising:
- generating the test clock signal in a test device that is separated from the integrated circuit die; and
- coupling the test clock signal to the test latch.

18. The method of claim 15, further comprising:
- storing multiple samples of the PI output clock signal in a memory in the test device, the samples having been sampled in the test latch.

19. The method of claim 15 wherein under-sampling the PI output clock signal further comprises under-sampling the PI output clock signal multiple times.

20. The method of claim 19 wherein generating a PI output clock signal further comprises:
- generating a reference signal in a Phase Locked Loop (PLL) on the integrated circuit die; and
- generating the PI output clock signal based on the reference signal in a PI circuit on the integrated circuit die.

21. The method of claim 20, further comprising controlling the PI circuit with a Joint Test Action Group (JTAG) control signal.

22. The method of claim 15, further comprising:
- incrementing a phase of the PI output clock signal generated by the PI circuit; and
- for each phase generated by the PI circuit, under-sampling the PI output clock signal in the test latch, the under-sampling being triggered by the test clock signal.

23. A system comprising:
- a peripheral component interconnect express (PCI-E) bus;
- a network controller coupled to the PCI-E bus, the network controller being located on an integrated circuit die and including:
  - a signal source to provide a first signal having a first frequency, the signal source being on the integrated circuit die; and
  - a test latch on the integrated circuit die, the test latch including:
    - a first input coupled to receive the first signal;
    - a clock input to receive a test clock signal, the test clock signal having a frequency lower than the first frequency; and
    - a data output to provide samples of the first signal to a test device that is separated from the integrated circuit die, the test latch to under-sample the first signal in accordance with the test clock signal.

24. The system of claim 23 wherein:
- a central processing unit (CPU) coupled to the PCI-E bus;
- a random access memory (RAM) and a plurality of data buffers coupled to the PCI-E bus; and
- a hard disk drive including a driver coupled to the PCI-E bus.

25. The system of claim 23, further comprising a bridge coupled to the PCI-E bus, the bridge including an arbiter.

26. The system of claim 23 wherein the signal source comprises:
- a PLL to generate a reference signal; and
- a phase interpolator (PI) circuit to receive the reference signal and to generate a PI output clock signal.

27. The system of claim 23 wherein the die is a silicon chip.

* * * * *